United States Patent [19]

Yasumoto et al.

[11] Patent Number: 4,612,083

[45] Date of Patent: Sep. 16, 1986

[54] PROCESS OF FABRICATING THREE-DIMENSIONAL SEMICONDUCTOR DEVICE

[75] Inventors: Masaaki Yasumoto; Hiroshi Hayama; Tadayoshi Enomoto, all of Tokyo, Japan

[73] Assignee: NEC Corporation, Tokyo, Japan

[21] Appl. No.: 755,987

[22] Filed: Jul. 17, 1985

[30] Foreign Application Priority Data

Jul. 20, 1984 [JP] Japan ............................... 59-150598

[51] Int. Cl.⁴ .................. B44C 1/22; B29C 17/08; C09J 5/02; C23F 1/02
[52] U.S. Cl. .................... 156/633; 29/576 J; 29/591; 148/1.5; 156/634; 156/643; 156/653; 156/656; 156/657; 156/659.1; 156/668; 156/307.3; 357/71; 427/89; 430/313; 430/314; 430/317; 430/318
[58] Field of Search ............... 156/633, 634, 643, 644, 156/646, 653, 656, 657, 659.1, 668, 307.3, 313; 430/313, 314, 315, 317, 318; 427/38, 39, 88–91; 357/65, 71; 29/571, 576 R, 576 W, 576 J, 578, 588, 591; 148/1.5, 187

[56] References Cited

U.S. PATENT DOCUMENTS 4,400,868 8/1983 Antypas et al. ............... 29/576 J
4,552,607 11/1985 Frey ............................. 156/307.3

Primary Examiner—William A. Powell
Attorney, Agent, or Firm—Sughrue, Mion, Zinn, Macpeak, and Seas

[57] ABSTRACT

A process of fabricating a three-dimensional semiconductor device, comprising the steps of preparing at least two multilayer structures each including at least one semiconductor element and a conductor connected at one end to the semiconductor element and having at the other end an exposed surface, at least one of the multilayer structures further including a thermally fusible insulating adhesive layer having a surface coplanar with the exposed surface of the conductor, positioning the multilayer structures so that the exposed surfaces of the respective conductors of the multilayer structures are spaced apart from and aligned with each other, moving at least one of the multilayer structures with respect to the other until the exposed surfaces of the conductors of the multilayer structures contact each other, and heating the multilayer structures for causing the insulating adhesive layer of at least one of the multilayer structures to thermally fuse to the other multilayer structure with the semiconductor elements electrically connected together.

15 Claims, 8 Drawing Figures

PROCESS OF FABRICATING THREE-DIMENSIONAL SEMICONDUCTOR DEVICE

FIELD OF THE INVENTION

The present invention relates to a process of fabricating a three-dimensional semiconductor device and, more particularly, to a process of forming a three-dimensional semiconductor device by first preparing two or more multilayer structures each having at least one semiconductor element formed therein and thereafter integrally uniting the multilayer structures together while providing electrical connections between the semiconductor elements in the multilayer structures.

BACKGROUND OF THE INVENTION

Two-dimensional semiconductor devices presently in production on a commercial basis include active and passive elements formed on one major surface of a substrate. In this instance, the integration density of the semiconductor elements formed on a single substrate can be increased by reducing the design rules and the sizes of the semiconductor elements. Excessive reduction of the design rules would however raise another problem in the fabrication process of semiconductor devices and would thus invite substantial reduction in the yield in the production of the devices. This means that reduction of the design rules is restricted from both technological and commercial points of view.

A three-dimensional semiconductor device has therefore been proposed with a view to achieving a drastically increased degree of integration density. Some methods are presently available for the fabrication of such a three-dimensional semiconductor device.

One of these prior-art methods is proposed by S. Kawamura and disclosed in International Electron Devices Meeting (IEDM) Technical Digests, 1983, pp. 364. In Kawamura's method, active and passive semiconductor elements are first formed on and/or in a major surface of a substrate and an insulating layer is thereafter deposited on the surface of the substrate to cover the individual semiconductor elements. In the description that follows, the layer which is thus formed on the major surface of a substrate and which contains active and/or passive semiconductor elements formed on and/or in the substrate and electrically isolated from other semiconductor elements will be referred to as functional layer. A polysilicon layer is then deposited on the insulating layer formed on the functional layer and is irradiated with a laser beam or an electron beam or heated by a strip heater so that the polysilicon is crystallized to provide a silicon-on-insulator (SOI) structure. In this crystallized polysilicon layer are then formed active and passive semiconductor elements to form a second functional layer, followed by interlayer wiring between the semiconductor elements in the first and second functional layers. These steps are repeated until a three-dimensional semiconductor device including two or more functional layers electrically isolated from one another results.

Thus, the method of Kawamura is, in essence, such that a plurality of functional layers are stacked one upon another by repeating the step of crystallizing a polysilicon layer, the step of forming semiconductor elements on the crystallized polysilicon layer and the step of covering these semiconductor elements with an insulating layer. Such a method has drawbacks in that difficulties are encountered in parallelizing the process steps and accordingly an objectionably prolonged period of time is required for the fabrication of a three-dimensional semiconductor device. It may also be pointed out that the semiconductor elements which have been formed on the substrate are subjected to heat during the step of crystallizing a polysilicon layer and would cause changes in the design parameters of the elements. Where, furthermore, a defective semiconductor element happens to be produced in any of the functional layers being formed one after another, such a semiconductor element could not be found out pending the post-fabrication inspection. This would also lead to a decrease in the yield of fabrication of a three-dimensional semiconductor device. Another problem is that the prior-art method is not fully acceptable for the production of semiconductor devices on a quantity basis since techniques making it possible to implement SOI structures with sufficient areas are indispensable for this purpose.

Another known method of fabricating a three-dimensional semiconductor device is proposed by R. D. Etchells et al and is described in the article "Development of a three-dimensional circuit integration technology and computer architecture", SPIE, vol. 282, Technical Issues in Focal Plane Development, pp. 64–74, 1981. This article focuses on the techniques of forming "feedthroughs" in each of stacked silicon chips and the techniques of forming "microinterconnects" to carry signals through the silicon chips. The feedthroughs are produced by the deposition of an array of aluminum dots on the surface of a silicon chip followed by the thermomigration of liquid droplets of aluminum through the chip. On the other hand, the formation of the microinterconnects starts with the deposition of a 1 mil thick spacer-bump on the surface of a chip. A thin film of solder alloy connected to a circuit connection is deposited on this spacer bump and thereafter the spacer-bump is etched out to allow the solder alloy film to float as a free-standing structure over the surface of the chip. The solder alloy, or microspring, on one silicon chip extends in crossing relationship to the microspring on the adjacent chip. The stacked silicon chips are then lightly pressed upon to cause the microsprings on the adjacent silicon chips to plastically deform against each other, whereupon the microsprings thus brought into contact with each other between every two of the stacked silicon chips are thermally fused together.

In connection with this prior-art method of fabricating a three-dimensional semiconductor device, there is further an article published by J. Y. M. Lee et al in "Aluminum Thermomigration Technology for 3-Dimensional Integrated Circuits", IEDM Technical Digests, 1983, pp. 66. This article teaches formation of an integrated circuit with CMOS FETs on a wafer which has been formed with feedthroughs by the thermomigration process, followed by formation of aluminum pads on the reverse surface of the wafer. No particulars regarding the geometry, particularly the lengthwise measurements of the microinterconnects are clarified in the article although the feedthroughs are stated to measure 4 mils in diameter. The illustrations appearing in the article according to R. D. Etchells et al however suggest that the lengths of the interconnects are approximately 3.3 times the diameters of the feedthroughs. Such lengths of the interconnects must be required to avoid break of the interconnects when the interconnects are caused to plastically deform distances approximating the 1 mil spacing between the surface of the chip and the interconnects floating over the chip surface. Where such long interconnects are arranged in crossing relationship between the adjacent silicon chips, considerably large proportions of the total areas of the chips are used for the coupling of the interconnects. This imposes restriction on the number of the interconnects available on each chip and results in reduction in the area of the chip available for the formation of semiconductor elements.

It is, accordingly, an important object of the present invention to provide a process of fabricating a three-dimensional semiconductor device with a drastically increased integration density.

It is another important object of the present invention to provide a process of fabricating a three-dimensional semiconductor device which can be manufactured by steps some of which can be parallelized to permit reduction of the time required for the production of the three-dimensional semiconductor device.

It is still another important object of the present invention to provide a process of fabricating a three-dimensional semiconductor device wherein each of the semiconductor elements formed during the process can be inspected for proper functioning at any stage of the process.

It is still another important object of the present invention to provide a process of fabricating a three-dimensional semiconductor device composed of multilayer structural portions resulting from two or more multilayer structures which can be integrally combined together by heating at a relatively low temperature which will not affect the performance characteristics or design parameters of each of the semiconductor elements in the multilayer structures.

It is still another important object of the present invention to provide a process of fabricating a three-dimensional semiconductor device composed of multilayer structural portions resulting from two or more multilayer structures which can be integrally combined together with use of minimum areas of the multilayer structures and without sacrificing the number of the semiconductor elements to be formed in each of the multilayer structures even when an increased number of multilayer structures are to be combined together.

Yet, it is another important object of the present invention to provide a process of fabricating a three-dimensional semiconductor device economically and with a satisfactory fabrication yield.

SUMMARY OF THE INVENTION

In accordance with the present invention, there is provided a process of fabricating a three-dimensional semiconductor device, comprising the steps of (1) preparing at least two multilayer or otherwise configured semiconductor structures each including at least one semiconductor element and a conductor electrically connected at one end to the semiconductor element and having at the other end thereof an exposed surface portion, at least one of the semiconductor structures further including a thermally fusible insulating adhesive layer having a surface substantially coplanar with the exposed surface of the conductor, (2) positioning the semiconductor structures with respect to each other so that the exposed surface portions of the respective conductors of the semiconductor structures are spaced apart from and substantially aligned with each other, (3) moving at least one of the semiconductor structures with respect to the other until the exposed surface portions of the respective conductors of the semiconductor structures are brought into contact with each other, and (4) heating the semiconductor structures, preferably, at a temperature which will substantially not affect the performance characteristics of the semiconductor element in each of the semiconductor structures, for causing the insulating adhesive layer of at least one of the semiconductor structures to thermally fuse to the other semiconductor structure with the semiconductor elements electrically connected together.

BRIEF DESCRIPTION OF THE DRAWINGS

The features and advantages of a process according to the present invention will be more clearly appreciated from the following description taken in conjunction with the accompanying drawings in which.

DETAILED DESCRIPTION OF THE INVENTION

A process according to the present invention will be hereinafter described first with reference to sections (a) to (f) of FIG. 1.

Figure 1:
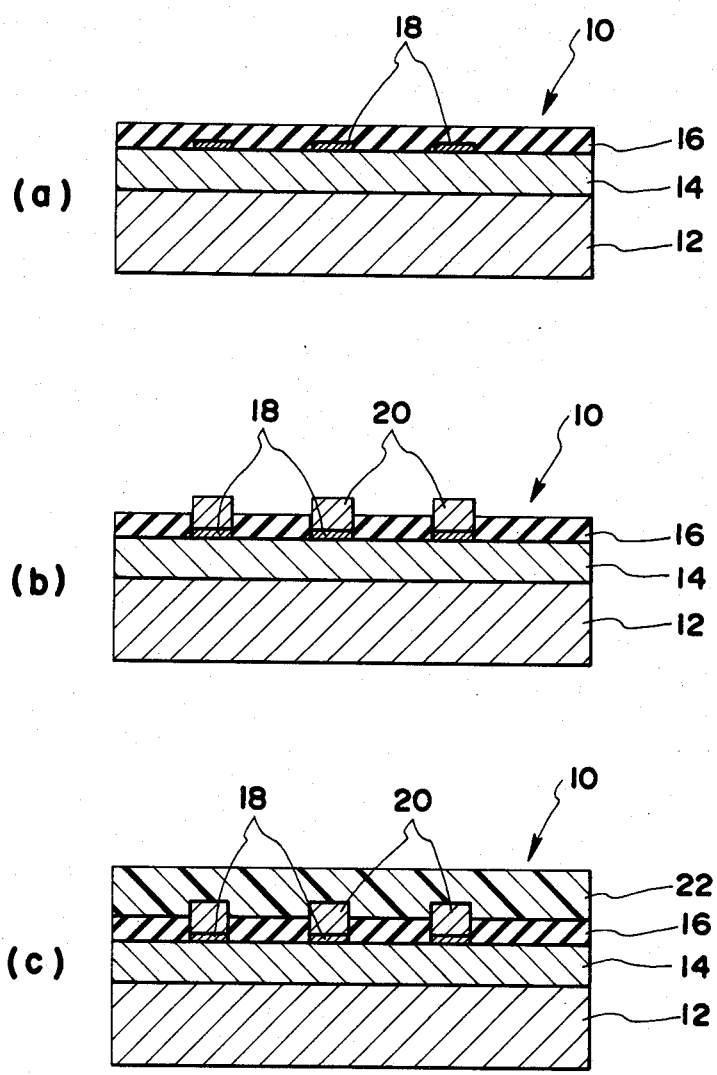
FIG. 1 consists in sections (a) to (f) which are fragmentary cross sectional views showing a preferred example of a process according to the present invention.
Figure 1:
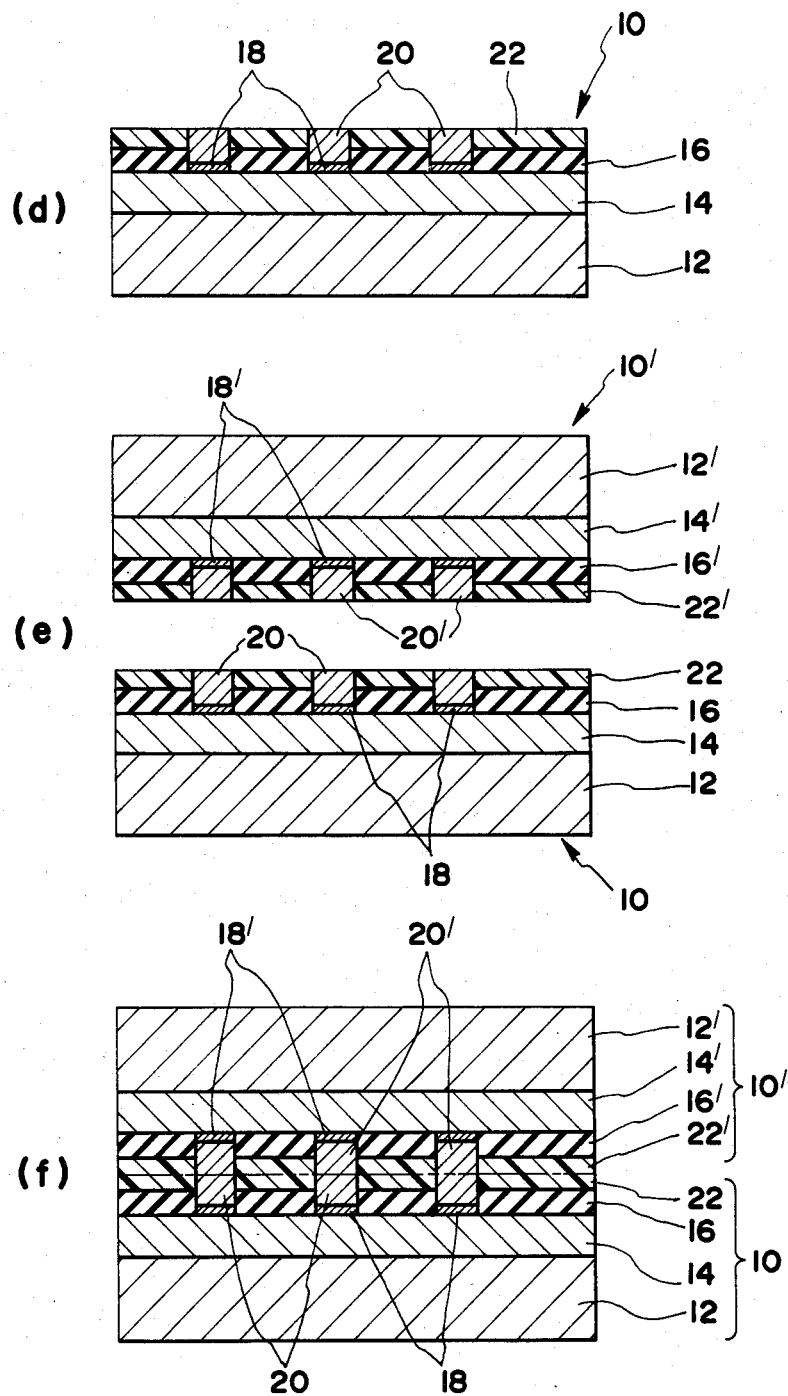

In section (a) of FIG. 1 is shown a multilayer structure 10 resulting from the first step of the process according to the present invention. The multilayer structure 10 comprises a substrate 12, an interlevel functional layer 14 overlying the substrate, and an insulating layer 16 of, for example, silicon dioxide deposited on the functional layer 14, the functional layer 14 having various semiconductor elements formed therein though not shown in FIG. 1. The substrate 12 may be formed of a semiconductor such as monocrystalline silicon or silicon dioxide or an insulator such as highly resistive gallium arsenide or sapphire. The substrate 12 of any of these materials is fabricated with use of any combination of the known semiconductor process technologies such as, for example, the thermal oxidation, diffusion, ion implantation, epitaxial growing, chemical or physical vapor deposition and photolithographic techniques used for the fabrication of two-dimensional integrated circuit devices. The interlevel functional layer 14 includes various active and/or passive semiconductor elements formed in and/or on the substrate 12 and electrically isolated from one another, though not shown in the drawings. These semiconductor elements may include not only such typical components of an electronic circuit as bipolar transistors, field-effect transistors (FETs), capacitors and resistors but also transducer elements such as optoelectric transducers, magnetoelectric transducers and photoelectromagnetic (PEM) transducers depending upon the application of the chip to result from the substrate. The material to form the substrate 12 is selected depending on the types and the desired performance characteristics of such semiconductor elements. Though not shown in FIG. 1, these semiconductor elements are electrically connected together by internal conductor layers 18 embedded in the insulating layer 16 to form a certain circuit. In brief, the multilayer structure 10 is fabricated by the use of a material and a process technology selected to suit the specific configuration and application of the circuit to be formed therein and depending upon the physical parameters which the final semiconductor chip are to provide for the intended application of the device.

The multilayer structure 10 thus fabricated to the configuration shown in section (a) of FIG. 1 is processed, typically using photolithographic techniques, to form openings in the insulating layer 16 to have the individual internal conductor layers 18 exposed through these openings. For this purpose, a photoresist is applied to the surface of the insulating layer 16 and, upon appropriate preliminary treatment, a patterned photomask is placed on the photoresist coating, which is then selectively exposed, developed and etched as is customary. The exposed regions of the insulating layer 16 are thus removed from the multilayer structure 10 to form openings arranged in a pattern following the pattern on the photomask used. As the etchant for the etching of the insulating layer may be used hydrofluoric acid (HF) where the insulating layer 16 consists of silicon dioxide. Appropriate electrically conductive metal such as typically gold is deposited on the surface of the insulating layer 16 to a thickness greater than the thickness of the insulating layer 16 with the film of the photoresist left on the insulating layer 16. Thus, the layer of gold in part covers the residual photoresist coating on the insulating layer 16 and in part fills the openings in the insulating layer 16. The layer of gold is then selectively etched to be removed or "lifted off" together with the photoresist coating remaining on the insulating layer 16 from its areas coextensive with the initial openings in the insulating layer 16. The layer of gold is in this fashion left in the initial openings in the insulating layer 16 and forms in each of the openings a bump slightly protruding from the surface of the insulating layer 16 as indicated at 20 in section (b) of FIG. 1. The metal bumps 20 thus formed have the thickness of about 1.5 micron from the surface of the interlevel functional layer 14, and of about 0.5 micron from the surface of the insulating layer 16 by way of example.

An appropriate dielectric polymeric adhesive is applied to the surface of the insulating layer 16 of the multilayer structure 10 now having the configuration shown in section (b) of FIG. 1. For this purpose, the dielectric polymeric adhesive, which may for example be a polyimide resin, is applied uniformly to the insulating layer 16 with the multilayer structure 10 fixedly supported on a spinner rotating at a high speed. A planar, insulating adhesive resin layer 22, which may be about 2.5 microns thick, is thus formed on the surface of the insulating layer 16 and the top faces of the individual metal bumps 20 as shown in section (c) of FIG. 1. The insulating adhesive resin layer 22 can be formed to a desired thickness accurately and uniformly over the area of the insulating layer 16 by appropriately selecting the speed of rotation and the period of time used for the spin coating operation. The spin coating process is thus adapted to form a sufficiently uniplanar adhesive coating on the insulating layer 16 without respect to the presence of the metal bumps 20 protruding from the surface of the layer 16. The insulating adhesive resin layer 22 is thereafter etched in, for example, the atmosphere of oxygen plasma to a depth which is uniform throughout its area to allow the individual metal bumps 20 to be exposed at a plane substantially flush with the surface of the residual adhesive resin layer 22 as shown in section (d) of FIG. 1.

The successive steps of forming the multilayer structure 10 having the configuration shown in section (d) of FIG. 1, viz., the step of forming the interlevel functional layer 14 on the substrate 12, the step of depositing the insulating layer on the functional layer 14, the step of forming the metal bumps 20, the step of forming the insulating adhesive resin layer 22, and the step of partially removing the adhesive resin layer 22 as above described may vary from one multilayer structure to another or may be common to a plurality of multilayer structures. In whichsoever case, two or even more of the multilayer structures having either similar or different configurations generally represented by the configuration shown in section (d) of FIG. 1 are to be used in the process steps subsequent to the step which has resulted in the configuration illustrated in section (d) of FIG. 1.

In section (e) of FIG. 1, these multilayer structures are shown consisting of two, first and second, multilayer structures 10 and 10'. These first and second multilayer structures 10 and 10 are assumed, by way of example, as having similar configurations each represented by the configuration of the multilayer structure 10 illustrated in section (d) of FIG. 1. The components of each of the first and second multilayer structures 10 and 10' are thus assumed to be respectively similar to those of the multilayer structure 10 shown in section (d) of FIG. 1 and, for this reason, the components of the second multilayer structure 10' are designated by numerals, each with a prime, identical with those of the respectively corresponding components of the first multilayer structure 10 and accordingly of the multilayer structure shown in section (d) of FIG. 1.

The first and second multilayer structures 10 and 10' are fixedly held in position on a pair of stages (not shown), respectively, of an aligner/welder system. One of these stages of the aligner/welder system is movable relative to the other in three perpendicularly transverse directions so that the two multilayer structures 10 and 10' carried on the stages are positioned with respect to each other with the metal bumps 20 in the first multilayer structure 10 respectively aligned with the metal bumps 20' in the second multilayer structure 10' using an off-axis alignment technique. The off-axis alignment method is implemented typically in the optical system of a de-magnifying projection exposure equipment and is per se well known in the art. Each of the stages carrying the first and second multilayer structures 10 and 10' is moved until a predetermined location of the stage is brought into registry with each of the two alignment marks located at a predetermined distance from each other in the aligner/welder system. Thereupon, one of the two stages is moved over the predetermined distance with respect to the other stage so that the former is positioned immediately below the latter. The two stages are in this manner moved to positions in which the metal bumps 20 in the first multilayer structure 10 are respectively held in alignment and contact with the metal bumps 20' in the second multilayer structure 10'. Experiments have revealed that, with a presently available alignment technique, layers each having fifty thousand metal bumps each of which measures 10 square microns can be united together with the metal bumps of one layer correctly aligned with those of the other.

The first and second multilayer structures 10 and 10' are then heated to cause fusion between the respective insulating adhesive resin layers 22 and 22' of the structures 10 and 10'. Where the insulating adhesive resin layer of each of the multilayer structures 10 and 10' is formed of a polyimide resin as previously noted, the multilayer structures 10 and 10 may be heated at a temperature ranging from about 250° C. to about 400° C. for about 20 minutes to about 60 minutes. When the insulating adhesive resin layers 22 and 22' thus fused together are thereafter allowed to cool and solidify, the two multilayer structures 10 and 10' are united together into a unitary multilayer structure as shown in section (f) of FIG. 1. In this unitary multilayer structure 10/10', the active and/or passive elements forming part of the interlevel functional layer 14 of the original first multilayer structure 10 are electrically connected to those in the functional layer 14' of the original second multilayer structure 10' through the metal bumps 20 of the former multilayer structure and the metal bumps 20' of the latter as will be seen from section (f) of FIG. 1. If desired, the unitary multilayer structure 10/10' may be pressed upon in the direction of thickness so that the multilayer structural portions resulting from the multilayer structures 10 and 10', respectively, are forced against each other and as a consequence each of the metal bumps 20 and 20' in the multilayer structural portions is prestressed. When the multilayer structure 10/10' is heated thereafter, each of the prestressed metal bumps 20 and 20' is caused to diffuse and alloy into the associated metal bump with a consequent decrease in the contact resistance between every associated two of the metal bumps 20 and 20', let alone the enhanced cohesion between the insulating adhesive layers 22 and 22'.

Figure 2:
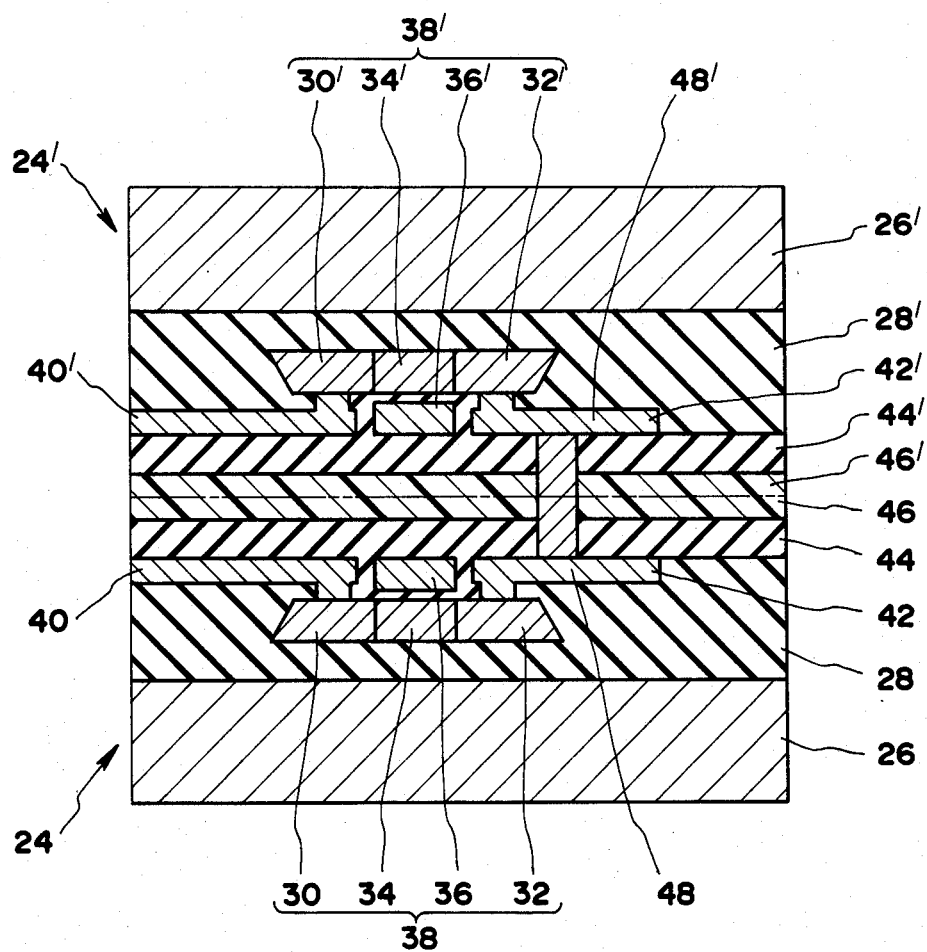
FIG. 2 is a fragmentary cross sectional view showing an example of a three-dimensional semiconductor device which can be fabricated by the process represented by sections (a) to (f) of FIG. 1.

FIG. 2 of the drawings shows the configuration of an example of the three-dimensional semiconductor devices which can be fabricated by the use of the process described above. As shown, the semiconductor device comprises two, first and second, multilayer structural portions 24 and 24' resulting from multilayer structures similar to the first and second multilayer structures 10 and 10', respectively, in the configuration illustrated in section (f) of FIG. 1. These first and second multilayer structural portions 24 and 24' are also assumed as having similar configurations by way of example.

The first multilayer structural portion 24 comprises a monocrystalline silicon substrate 26 and an interlevel insulating layer 28 of silicon dioxide overlying the substrate 26. The insulating layer 28 has provided therein a silicon layer in which are formed a source region 30, a drain region 32 laterally spaced apart from the source region 30, and a channel region 34 intervening between the source and drain regions 30 and 32. A diffused silicon gate 36 is vertically spaced apart from the channel region 34 across a gate insulator. These source region 30, drain region 32, channel region 34, silicon gate 36 and gate insulator construct one of a plurality of thin-film transistors, the particular one being indicated at 38. The source region 30 and the drain region 32 are held in contact with metal conductor layers 40 and 42, respectively, received in the insulating layer 28. These metal conductor layers 40 and 42 and the transistor 38 are associated with various active and/or passive elements also provided in the interlevel insulating layer 28 and constitute in combination with these active and/or passive elements a desired semiconductor integrated circuit. Thus, the insulating layer 28 having the transistor 38 formed therein corresponds to each of the interlevel functional layers 14 and 14' in the multilayer structure shown in section (f) of FIG. 1. On this interlevel insulating layer 28 is formed a insulating layer 44 of silicon dioxide which has the thin-film transistor 38 and the metal conductor layers 40 and 42 embedded therein so that the diffused gate region 36 of the transistor 38 are isolated from the metal conductor layers 40 and 42 and the other regions of the transistor 38. On the surface of the insulating layer 44, in turn, is formed a spin-coated insulating adhesive resin layer 46 through which a metal bump 48 extends from the metal conductor layer 42 for the drain region 32 of the transistor 38 to a plane substantially flush with the surface of the adhesive resin layer 46 as shown.

The second multilayer structural portion 24' consists of components which are respectively similar to these components of the first multilayer structural portion 24 and which are thus designated by numerals, each with a prime, identical with those of the corresponding components of the first multilayer structural portion 24. The respective insulating adhesive resin layers 46 and 46' of the first and second multilayer structural portions 24 and 24' are fusion bonded together so that all the pairs of corresponding components of the multilayer structural portions 24 and 24' are located symmetrically with respect to the interface between the insulating adhesive resin layers 46 and 46' of the multilayer structural portions 24 and 24' with the metal bumps 48 and 48' aligned together. The metal bumps 48 and 48' of the multilayer structural portions 24 and 24' are held in contact each at one end with the metal conductor layers 48 and 48', respectively, and are connected together at the other ends thereof, thereby establishing electrical connection between the respective drain regions 32 and 32' of the multilayer structural portions 24 and 24'.

Figure 3:
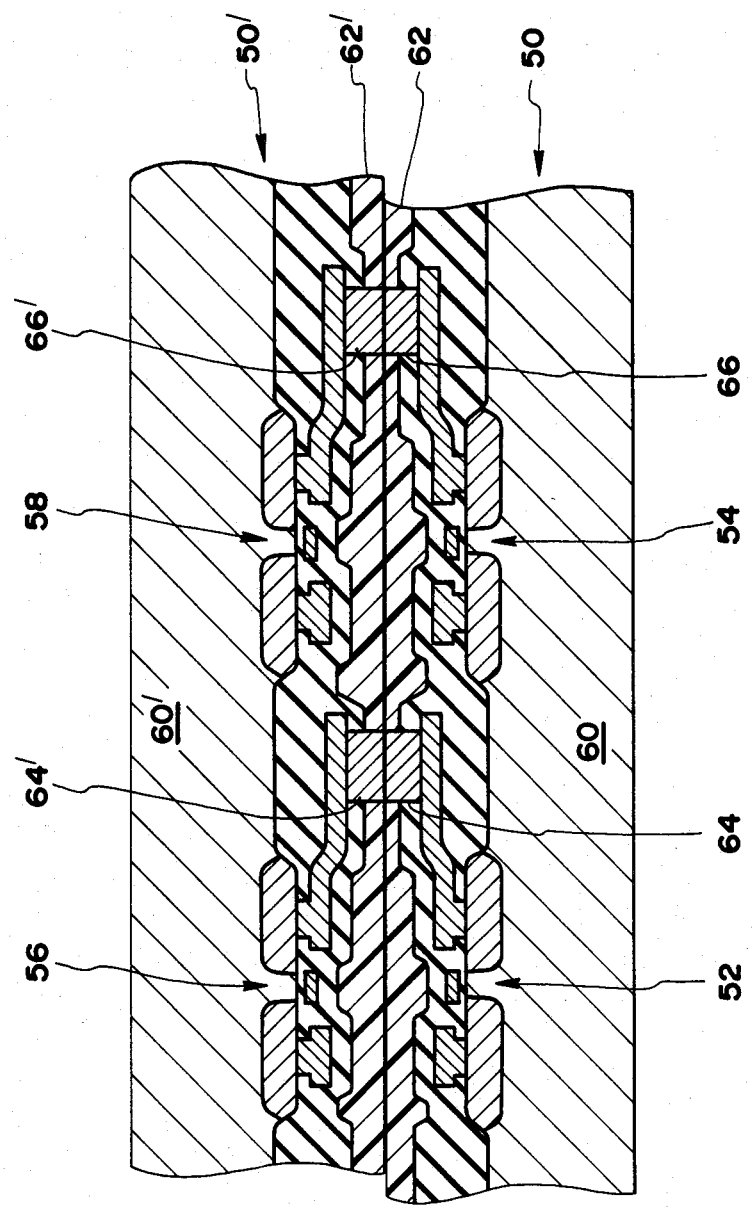
FIG. 3 is a fragmentary cross sectional view showing another example of a three-dimensional semiconductor device which can be fabricated by the process represented by sections (a) to (f) of FIG. 1.

FIG. 3 of the drawings shows the configuration of another example of the three-dimensional semiconductor devices which can be fabricated by the process described with reference to sections (a) to (f) of FIG. 1. As shown, the semiconductor device comprises two multilayer structural portions which consist of a first multilayer structural portion 50 having n-channel MOS transistors 52 and 54 formed on a p-type silicon substrate 60 and a second multilayer structural portion 50' having p-channel MOS transistors 56 and 58 on an n-type silicon substrate 60'. The device shown further comprises insulating adhesive resin layers 62 and 62' which form part of the first and second multilayer structural portions 50 and 50', respectively, and which are fusion bonded to each other. The n-channel MOS transistor 52 on the p-type substrate 60 and the p-channel MOS transistor 56 on the n-type substrate 60' are electrically connected together by metal bumps 64 and 64' which form part of the first and second multilayer structural portions 50 and 50', respectively, and which are aligned with and connected to each other through the adhesive resin layers 62 and 62'. Likewise, the n-channel MOS transistor 54 on the p-type substrate 60 and the p-channel MOS transistor 58 on the n-type substrate 60' are electrically connected together by metal bumps 66 and 66' forming part of the multilayer structural portions 50 and 50', respectively, and aligned with and connected to each other through the adhesive resin layers 62 and 62'. The device in which the MOS transistors 52/54 and 56/58 having the different conductivity types are thus provided in the two multilayer structural portions 50 and 50', respectively, is substantially free from formation of a parasitic thyristor and is for this reason advantageous in that complementary MOS transistors can be formed with an increased circuit density in each of the multilayer structural portions 50 and 50' without a fear of inviting latchups of the transistors.

Figure 4:
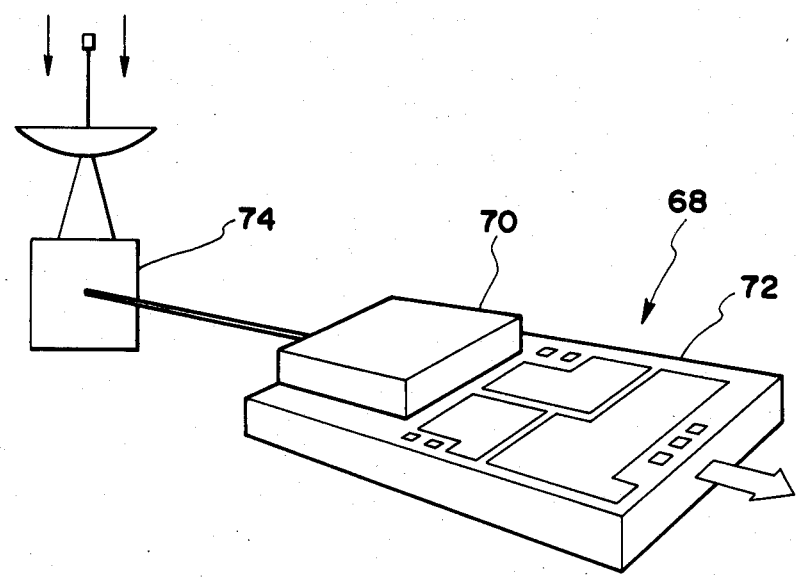
FIG. 4 is a perspective view view showing a preferred example of a practical application of a three-dimensional semiconductor device fabricated in accordance with the present invention.

In FIG. 4 of the drawings is shown the arrangement including a microwave processing unit 68 constituted by a three-dimensional semiconductor device. Though not shown, the microwave processing unit 68 includes a multilayer structure consisting of a first multilayer structural portion having an integrated circuit formed on a substrate of highly resistive gallium arsenide and a second multilayer structural portion having an integrated circuit formed on a substrate of monocrystalline silicon. The integrated circuits in these first and second multilayer structural portions are electrically connected together by means of metal bumps as in the structures described with reference to FIGS. 2 and 3. The first multilayer structural portion is used to construct a high-speed signal processor 70 and the multilayer structural portion used to construct a digital signal processor 72. The high-speed signal processor 70 is connected to a microwave receiver unit 74 which receives microwave signals. The microwave signals received by the microwave receiver unit 74 are passed to and digitized by the high-speed signal processor 70. The resultant digital signals are supplied to the digital signal processor 72 and are processed in accordance with a predetermined program. The microwave processing unit 68 is thus characterized in that the circuit integrated on the gallium arsenide substrate deals with the operations which require high-speed processing and the circuit integrated on the silicon substrate is used for the operations which need not high-speed processing. The semiconductor device of this nature is useful for offering both of the performance and economy features in a single structure.

Figure 5:
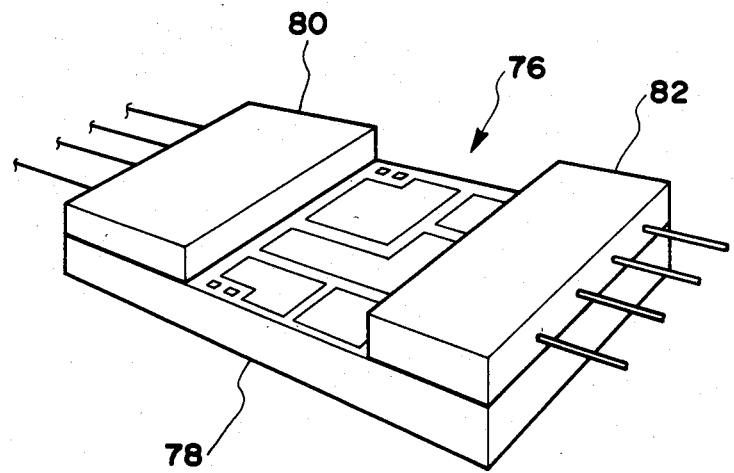
FIG. 5 is a perspective view showing another preferred example of a practical application of a three-dimensional semiconductor device fabricated in accordance with the present invention.

FIG. 5 of the drawings shows a three-dimensional semiconductor device 76 for optoelectronic use which comprises a digital signal processor 78 and optoelectric transducer integrated circuits 80 and 82 connected to the input and output sides, respectively, of the signal processor 78. Though not shown, the digital signal processor 78 includes a multilayer structural portion having an integrated circuit formed on a silicon substrate and each of the optoelectric transducer integrated circuits 80 and 82 includes a multilayer structural portion formed on the multilayer structural portion constituting the signal processor 78. The three-dimensional semiconductor device of this nature can also be fabricated by the process according to the present invention and is useful for implementing both the interface between optical and electric signals and the processing of the electric signals in a single structure.

In the meantime, it has been assumed that each of the multilayer structural portions forming part of the semiconductor device fabricated in accordance with the present invention is constituted by an individual semiconductor chip separated from a wafer forming a multiplicity of integrated circuit units. Two of the chips thus prepared from a single wafer or respectively from different wafers are united together to form a desired three-dimensional semiconductor device. If desired, however, multilayer structures preliminarily fabricated each in the form of a chip may be applied to a wafer forming a multiplicity of integrated circuit units.

Figure 6:
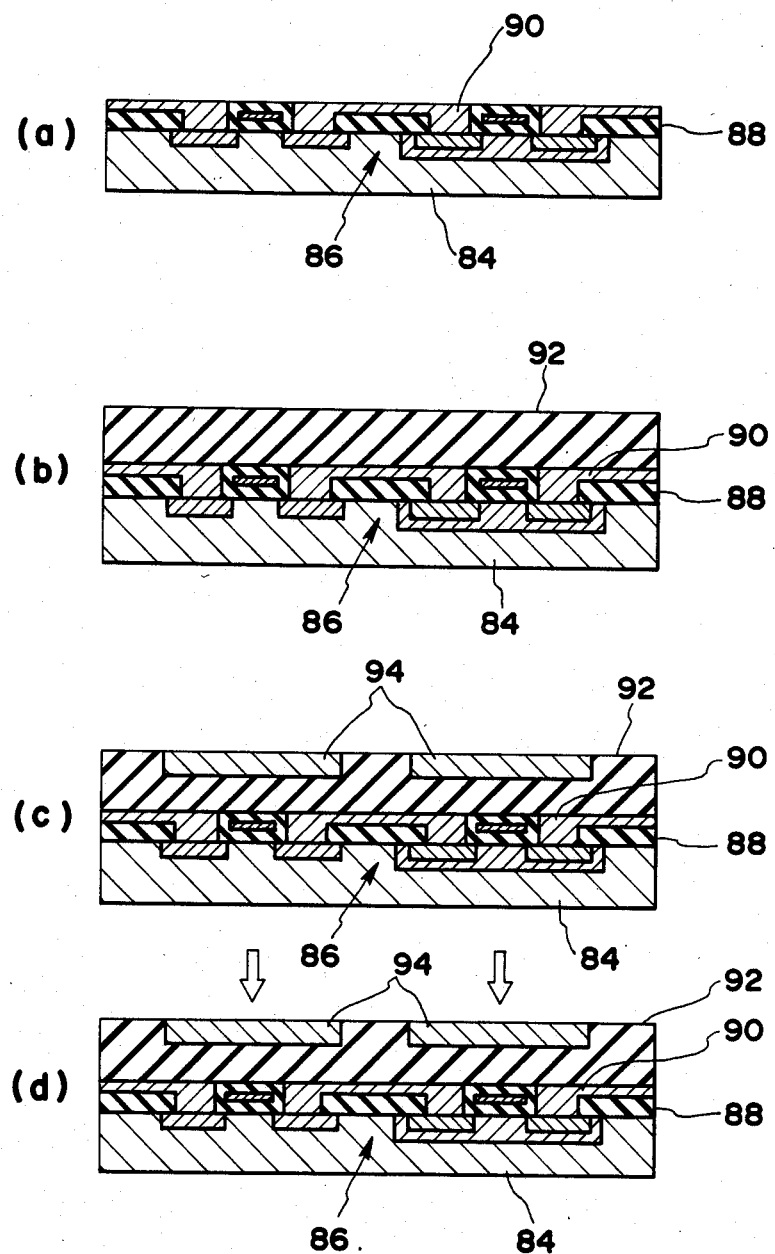
FIG. 6 consists in sections (a) to (g) which are fragmentary cross sectional views showing another preferred example of a process according to the present invention.
Figure 6:
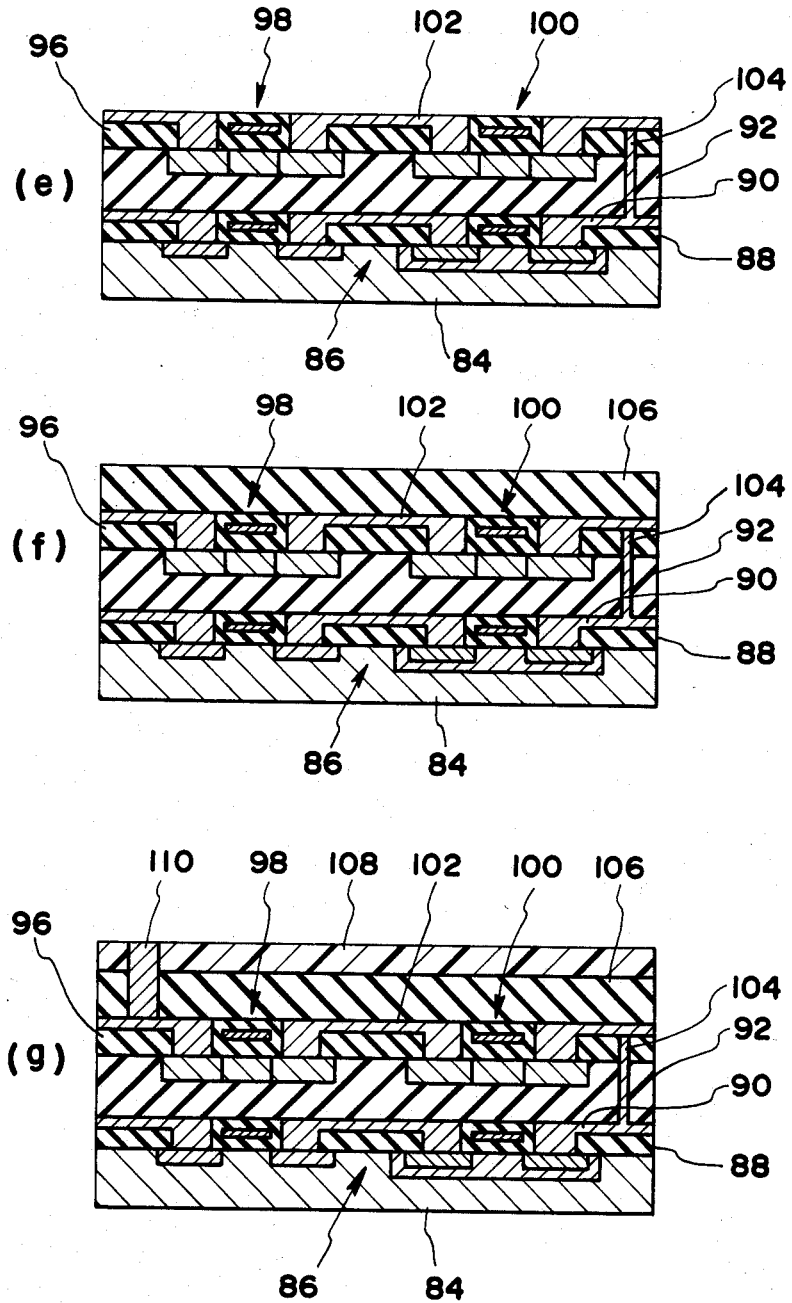

FIG. 6 of the drawings shows the process flow of a modification of the process described with reference to sections (a) to (f) of FIG. 1.

The process flow of FIG. 6 uses an n-type monocrystalline silicon substrate 84 and starts with formation of a complementary MOS transistor 86 in and on the silicon substrate 84, followed by formation of an interlevel insulating layer 88 of silicon dioxide and metal conductor layers 90 as shown in section (a) of FIG. 6. The steps of forming the complementary MOS transistor 86 are per se well known in the art and will not be herein described. A thick insulating layer 92 is then deposited on the metal conductor layers 90 and the exposed areas of the interlevel insulating layer 88 (section (b) of FIG. 6) and a polysilicon layer 94 is formed in this thick insulating layer 92 (section (c) of FIG. 6). This polysilicon layer 94 is irradiated with a laser beam as indicated by arrows in section (d) of FIG. 6 in order to be monocrystallized throughout its thickness. An insulating layer 96 is deposited on the surface of the resultant structure, followed by formation of openings above selected areas of the monocrystalline silicon layer 94. MOS transistors 98 and 100 are then formed partly in the monocrystalline silicon layer 94 and partly within the insulating layer 96, whereupon a metal conductor layer 102 is deposited on the MOS transistors 98 and 100 through the openings in the insulating layer 96 in order to provide connection between the two MOS transistors 98 and 100 (section (e) of FIG. 6). The metal conductor layer 102 includes an interlayer conductor portion provided to interconnect the complementary MOS transistor 86 and one of the MOS transistors 98 and 100 through the insulating layers 92 and 96 as indicated at 104 in section (e) of FIG. 6. The step which has resulted in the configuration shown in section (e) of FIG. 6 is followed by the successive process steps previously described with reference to sections (a) to (d) of FIG. 1. An additional insulating layer 106 is thus formed by deposition on the metal conductor layer 102 and the exposed areas of the insulating layer 96 (section (f) of FIG. 6), and an insulating adhesive resin layer 108 is spin coated on this additional insulating layer 108 with a metal bump 110 provided through the insulating layer 106 and the adhesive resin layer 108 (section (g) of FIG. 6). In this instance, it will be apparent that the additional insulating layer 106, insulating adhesive resin layer 108 and metal bump 110 correspond to the insulating layer 16, adhesive resin layer 22 and metal bumps 20, respectively, in the configuration illustrated in section (d) of FIG. 1. The multilayer structure produced in this manner has two functional layers, one including the complementary MOS transistor 86 and the other including the MOS transistors 98 and 100. Two of such multilayer structures are combined together into a unitary three-dimensional semiconductor structure as by the steps described with reference to sections (e) and (f) of FIG. 1, although the resultant multilayer structure is not herein shown.

Figure 7:
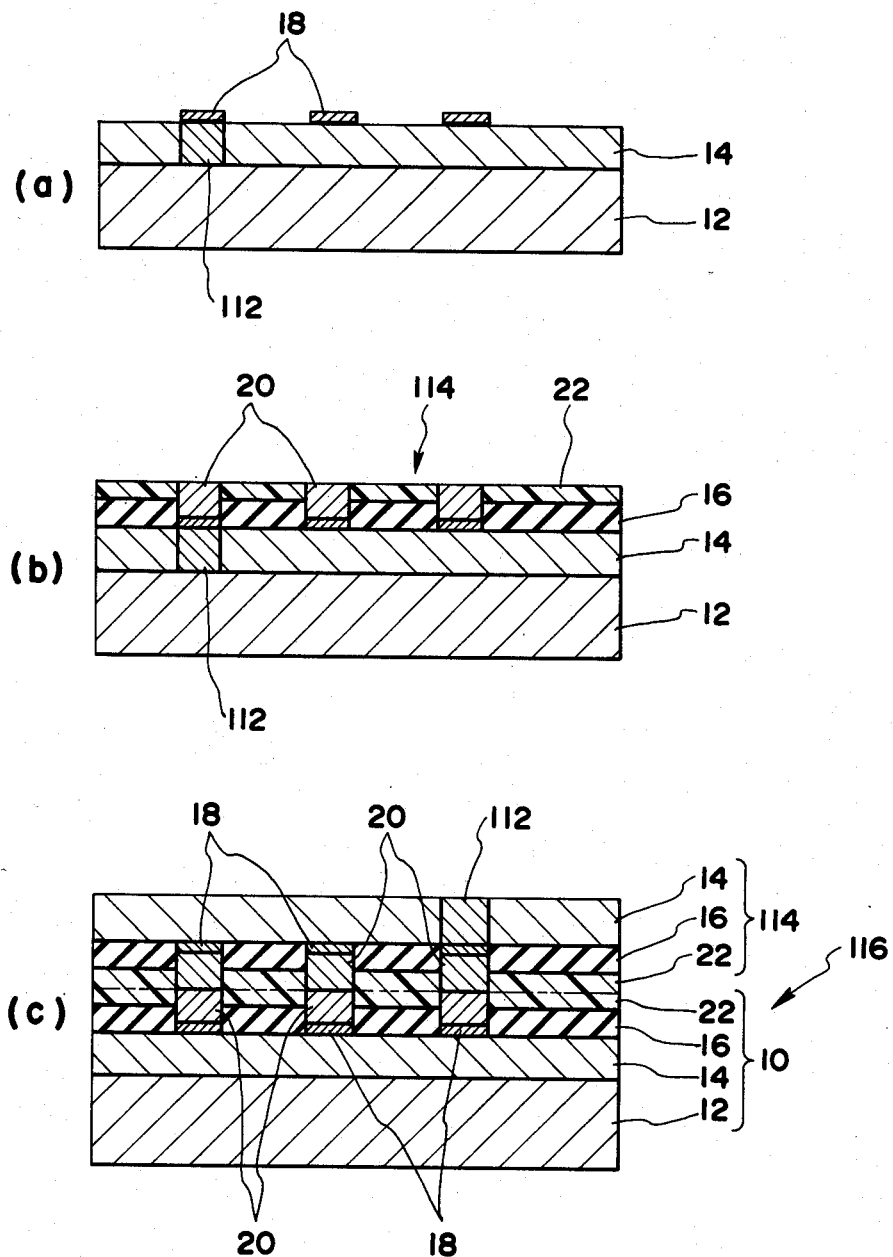
FIG. 7 is a view consisting of in sections (a) to (e) which are fragmentary cross sectional views showing still another preferred example of a process according to the present invention.
Figure 7:
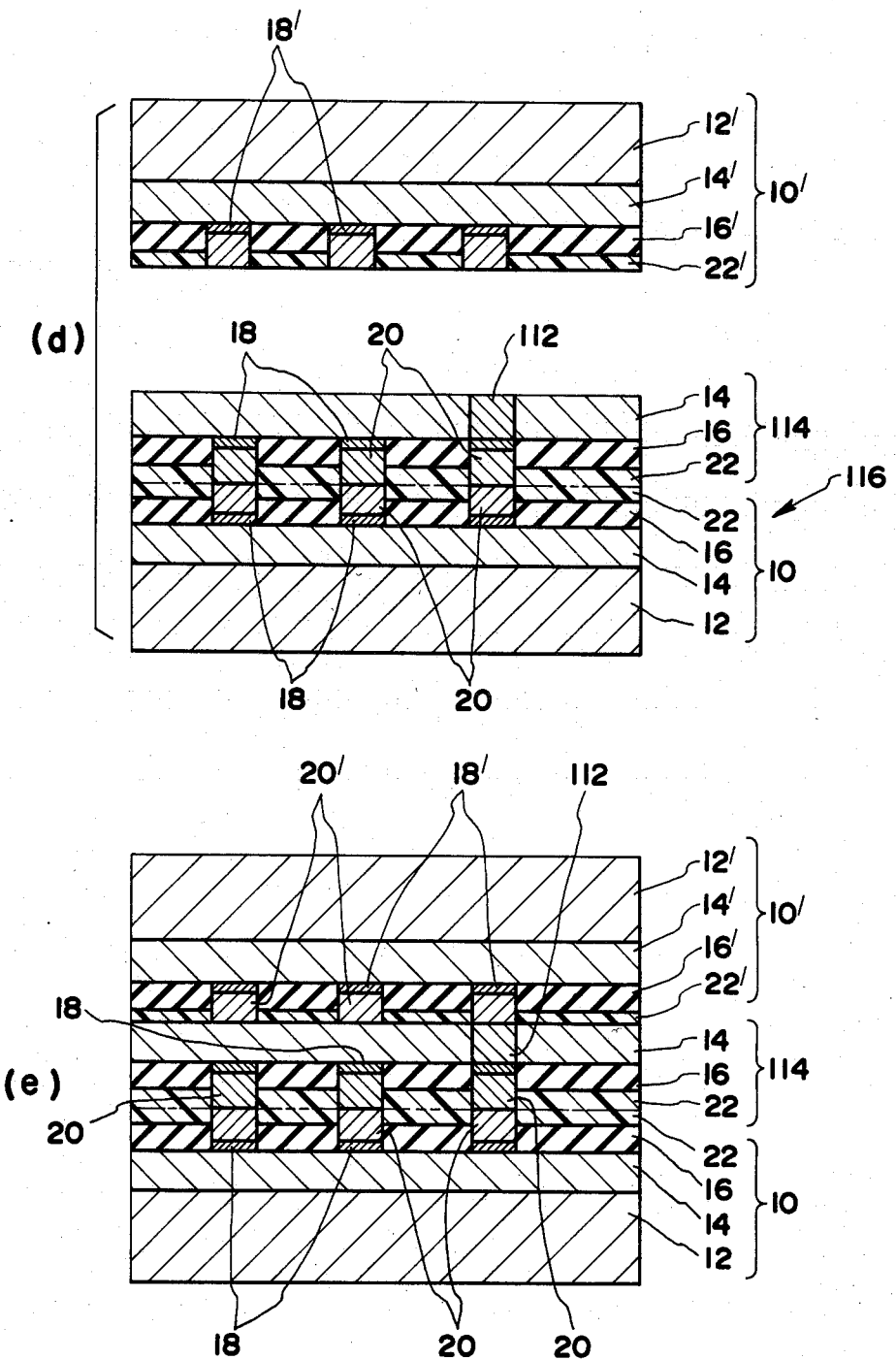

FIG. 7 of the drawings shows the process flow of another modification of the process described with reference to sections (a) to (f) of FIG. 1.

The process flow of FIG. 7 initially uses a multilayer structure consisting of a substrate and an interlevel functional layer which are similar to the substrate 12 and functional layer 14 of the multilayer structure shown in section (a) of FIG. 1. In this instance, however, the functional layer 14 is provided not only with active and/or passive elements but also with a conductive element 112 which extends throughout the functional layer 14 between the surface of the substrate 12 and one of the internal conductor layers 18 in the insulating layer 16 as shown in section (a) of FIG. 7. The conductive element 112 may be formed by the conventional photolithographic technique. The step which has resulted in the configuration shown in section (a) of FIG. 7 is followed by the successive process steps represented by sections (a) to (d) of FIG. 1 so that a multilayer structure 114 having the configuration shown in section (b) of FIG. 7 is obtained.

The multilayer structure 114 produced in this manner is then combined with two of the multilayer structure 10 produced as a result of the process step represented by section (d) of FIG. 1. For this purpose, the multilayer structure 114 is first combined with one of the multilayer structures 10 with the respective insulating adhesive resin layers 22 of the two multilayer structures 10 and 114 fusion bonded together and the metal bumps 20 of the multilayer structure 10 respectively connected to the metal bumps 20 of the multilayer structure 114. This can be performed by following the process steps described with reference to sections (e) and (f) of FIG. 1. The substrate 12 of the multilayer structure 114 is then removed to obtain a unitary multilayer structure in which the conductive element 112 which has been embedded in the functional layer 14 in the structure 114 is exposed at a plane flush with the now exposed surface of the functional layer 14 as shown in section (c) of FIG. 7. To the resultant three-dimensional multilayer structure 116 is further added the other of the multilayer structures 10', now designated by 10' in section (d) of FIG. 7, in which the components of the third multilayer structure 10' are designated by numerals, each with a prime, identical with those of the respectively corresponding components of the multilayer structure 10. The composite multilayer structure 116 and the third multilayer structure 10' are fixedly supported on the stages, respectively, of an aligner/welder system (not shown) and are united together by the use of the steps described with reference to sections (e) and (f) of FIG. 1. In this instance, however, the insulating adhesive resin layer 22' of the third multilayer structure 10' is fusion bonded to the functional layer 14 forming part of the initial multilayer structure 114. In the three-dimensional multilayer structure thus constructed, the conductive element 112 formed in the initial multilayer structure 114 is held in contact at one end with one of the metal conductor layers 18 in the initial multilayer structure 114 and at the other with one of the metal bumps 20' in the initial multilayer structure 10' and thus provided electrical connection between one of the metal conductor layers 18 in the initial multilayer structure 10 and one of the metal conductor layers 18' in the initial multilayer structure 10' as will be seen from section (e) of FIG. 7.

Figure 8:
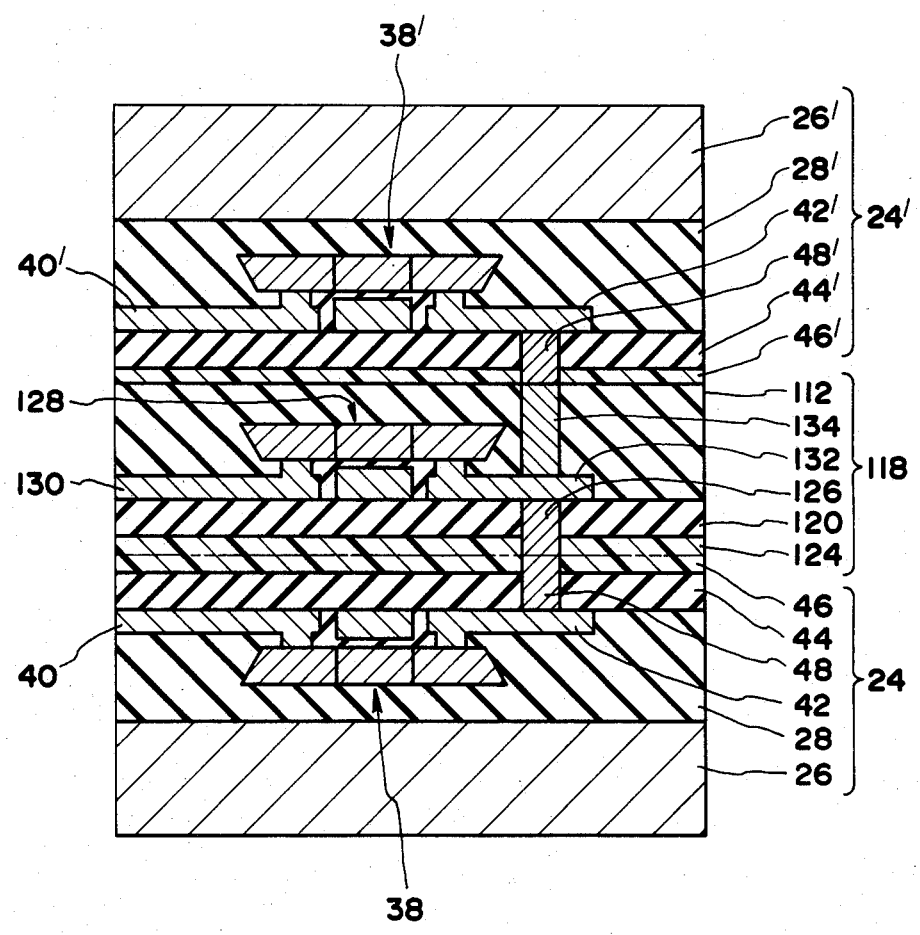
FIG. 8 is a fragmentary cross sectional view showing an example of a three-dimensional semiconductor device which can be fabricated by the process represented by sections (a) to (e) of FIG. 7.

In FIG. 8 of the drawings is shown the configuration of an example of the three-dimensional semiconductor devices which can be fabricated by the use of the process described above with reference to FIG. 7. As shown, the semiconductor device comprises two, first and second, multilayer structural portions respectively similar to the first and second multilayer structural portions 24 and 24' constituting the semiconductor device shown in FIG. 2. Between these first and second multilayer structural portions 24 and 24' is provided a third multilayer structural portion which is essentially similar in configuration to the multilayer structure 116 shown in section (c) of FIG. 7. Thus, the third multilayer structural portion 118 is devoid of a substrate and comprises inner and outer insulating layers 120 and 122 each of silicon dioxide and a spin-coated insulating adhesive resin layer 124 underlying the inner insulating layer 120. There is further provided a metal bump 126 which extends through the inner insulating layer 120 and the adhesive resin layer 124. In the outer insulating layer 122 opposite to the insulating adhesive resin layer 124 are formed a plurality of thin-film transistors one of which is indicated at 128. The thin-film transistor 128 is assumed to be similar in construction to the transistors 38 and 38' included in the first and second multilayer structural portions 24 and 24' and has its source and drain regions held in contact with metal conductor layers 130 and 132, respectively, which are received in the insulating layer 122. One of these metal conductor layers such as for example the metal conductor layer 132 as shown has one of its faces in contact with the above mentioned metal bump 122 and the other of its faces in contact with a conductive element 134 which extends through the insulating layer 120 as shown. The first, second and third multilayer structural portions 24, 24' and 118 are combined together with the adhesive resin layer 46 of the first multilayer structural portion 24' fusion bonded to the adhesive resin layer 124 of the third multilayer structural portion 118 and with the adhesive resin layer 46' of the second multilayer structural portion 24' fusion bonded to the outer insulating layer 122 of the third multilayer structural portion 118. The metal bump 48 in the first multilayer structural portion 24 is aligned with and connected to the metal bump 126 in the third multilayer structural portion 118 and, likewise, the metal bump 48' in the second multilayer structural portion 24' is aligned with and connected to the conductive element 134 forming part of the third multilayer structural portion 118.

While a multilayer structural portion essentially constructed in the form of the multilayer structure shown in section (b) of FIG. 7 is interposed between two multilayer structural portions respectively similar to the multilayer structural portions forming the structure of FIG. 2, a three-dimensional semiconductor structure having four or more multilayer structural portions could be obtained when two or more of the multilayer structural portion 118 are provided between the two outer multilayer structural portions 24 and 24'.

As will have been understood from the foregoing description, the process according to the present invention is advantageous firstly in that one of the component multilayer structural portions to form a three-dimensional semiconductor device can be fabricated independently of the other multilayer structural portion or structures. The multilayer structures to form such component structural portions of the device can thus be manufactured concurrently or in parallel production lines. This will significantly contribute to reduction of the time required for the manufacture of three-dimensional semiconductor devices on a quantity production basis.

Secondly, the process according to the present invention is advantageous in that the individual multilayer structures to form a three-dimensional semiconductor device can be welded together at a relatively low temperature which is merely required to cause the insulating adhesive resin layers of the component structures. This will prove conducive to preventing changes of the device parameters as would otherwise be caused by the welding process and will thus give rise to an increase in the fabrication yield of three-dimensional semiconductor devices.

Because, furthermore, of the fact that the steps of forming each of the multilayer structures need not be immediately followed by the steps of welding the multilayer structures together, the semiconductor elements which have been formed in the multilayer structures can be inspected for proper functioning before the multilayer structures are to be combined together. Defective semiconductor elements which may happen to be formed in the multilayer structures can thus be found out at any stage of the fabrication process. This again will result in an increase in the fabrication yield of three-dimensional semiconductor devices.

Another advantage is that the process according to the present invention can be put into practice on a commercial basis without having recourse to development of any new or additional technologies for the formation of each of the component multilayer structures per se of a three-dimensional semiconductor device since each of such multilayer structures may be provided in the form of a chip separated from a wafer. A further advantage of the process according to the present invention is that, since the multilayer structures to form a three-dimensional semiconductor device are welded together with the conductors in one multilayer structure aligned with those in the other multilayer structure, the three-dimensional semiconductor device can be formed with use of minimum areas of the multilayer structures and without sacrificing the number of the semiconductor elements to be formed in each of the multilayer structures even when an increased number of multilayer structures are to be combined together.

What is claimed is:

1. A process of fabricating a three-dimensional semiconductor device, comprising the steps of
    (1) preparing at least two semiconductor structures each including at least one semiconductor element and a conductor electrically connected at one end to said semiconductor element and having at the other end thereof an exposed surface portion, at least one of said semiconductor structures further including a thermally fusible insulating adhesive layer having a surface substantially coplanar with said exposed surface of said conductor,
    (2) positioning said semiconductor structures with respect to each other so that the exposed surface portions of the respective conductors of the semiconductor structures are spaced apart from and substantially aligned with each other,
    (3) moving at least one of said semiconductor structures with respect to the other until the exposed surface portions of the respective conductors of the semiconductor structures are brought into contact with each other, and
    (4) heating the semiconductor structures for causing said insulating adhesive layer of at least one of said semiconductor structures to thermally fuse to the other semiconductor structure with said semiconductor elements electrically connected together.

2. A process as set forth in claim 1, in which the semiconductor structure including said insulating adhesive layer is prepared by
    (1) forming on a substrate a functional layer containing said semiconductor element therein,
    (2) forming an insulating layer overlying said functional layer for covering the semiconductor element in the functional layer,
    (3) forming said conductor extending in part in said insulating layer and, the conductor being electrically connected at one end to said semiconductor element and having said exposed surface portion protruding from the surface of the insulating layer, and
    (4) forming said insulating adhesive layer on said insulating layer so that said conductor is in part embedded in the insulating adhesive layer and has its exposed surface portion substantially coplanar with the surface of the insulating adhesive layer.

3. A process as set forth in claim 2, in which said conductor in the semiconductor structure including said insulating adhesive layer is formed by
    (1) forming an opening in said insulating layer with a patterned photoresist coating formed on the insulating layer,
    (2) depositing an electrically conductive material in said opening and on said photoresist coating for forming a conductive layer thicker than said insulating layer and electrically connected to said semiconductor element, and
    (3) removing said photoresist coating and that portion of the conductive layer which overlies the photoresist coating from said insulating layer for thereby forming said conductor.

4. A process as set forth in claim 2, in which said insulating adhesive layer is formed by
    (1) spin coating the surface of said insulating layer with a dielectric adhesive substance rotating the semiconductor structure including said insulating layer for forming a coating of the dielectric adhesive substance to a thickness greater than the height which said conductor protrudes from the surface of said insulating layer, and
    uniformly etching the coating of the dielectric adhesive substance to a depth which is uniform substantially throughout its area for causing said exposed surface to appear on a plane substantially flush with the surface of the resultant insulating adhesive layer.

5. A process as set forth in claim 1, in which at least one of said semiconductor structures includes a plurality of functional layers each containing a semiconductor element therein, an insulating layer intervening between adjacent two of the plurality of functional layers, and a conductive element extending through said insulating layer and interconnecting the semiconductor elements in the adjacent functional layers.

6. A process as set forth in claim 1, in which each of said semiconductor structures includes a plurality of functional layers each containing at least one semiconductor element therein, an insulating layer intervening between adjacent two of the plurality of functional layers, and a conductive element extending through said insulating layer and interconnecting the semiconductor elements in the adjacent functional layers.

7. A process as set forth in claim 5 or 6, in which said plurality of functional layers include first and second functional layers and in which the semiconductor structure including the first and second functional layers is prepared by
  (1) forming the first functional layer on a substrate,
  (2) depositing said insulating layer on the first functional layer as a first insulating layer for covering the semiconductor element contained in the first functional layer,
  (3) forming the second functional layer by forming a monocrystalline semiconductor film forming at least one semiconductor element electrically connected to the semiconductor element in said first functional layer across said first insulating layer,
  (4) forming a second insulating layer on said second functional layer, and
  (5) forming said conductor extending through said second insulating layer, the conductor being connected at one end to the semiconductor element in said second functional layer and having said exposed surface portion substantially coplanar with the surface of the second insulating layer.

8. A process as set forth in claim 6, in which said semiconductor structures are prepared by
  (1) forming a first semiconductor structure including (a) a first functional layer formed on a substrate and containing at least one semiconductor element therein, (b) a second insulating layer formed on the first functional layer and covering the semiconductor element in the functional layer, (c) an insulating adhesive layer formed on the insulating layer, and (d) a first conductor extending through said insulating layer and said insulating adhesive layer, the first conductor being electrically connected at one end to the semiconductor element in said first functional layer and having an exposed surface portion substantially flush with the surface of the first insulating adhesive layer; and a second semiconductor structure including (e) a second functional layer formed on a substrate and containing at least one semiconductor element therein, (f) a second insulating layer formed on the second functional layer and covering the semiconductor element in the functional layer, (g) an insulating adhesive layer formed on the insulating layer, (h) a second conductor extending through said insulating layer and said insulating adhesive layer, the second conductor being electrically connected at one end to the semiconductor element in said second functional layer and having an exposed surface portion substantially flush with the surface of the second insulating adhesive layer, and (i) a third conductor extending through said second functional layer and electrically connected at one end to the semiconductor element in said second functional layer, the third conductor having the other end thereof located at the interface between the substrate and the second functional layer and being electrically isolated from said second functional layer,
  (2) positioning the first and second semiconductor structures with respect to each other so that the respective insulating adhesive layers thereof are spaced apart from each other,
  (3) locating the first and second semiconductor structures with respect to each other so that the respective exposed surface portions of the first and second conductors are substantially aligned with each other,
  (4) moving at least one of said first and second semiconductor structures with respect to the other until the respective exposed surface portions of said first and second conductors of the semiconductor structures are brought into contact with each other,
  (5) heating the first and second semiconductor structures at a temperature which will substantially not affect the performance characteristics of the semiconductor element in each of the semiconductor structures, for causing said first and second insulating adhesive layers of the semiconductor structures to thermally fuse to each other with the semiconductor elements in the first and second semiconductor structures electrically connected together, and
  (6) removing the substrate from said second semiconductor structure for allowing said third conductor to be exposed at one end thereof from said second functional layer.

9. A process as set forth in claim 8, in which said first and second semiconductor structures are forced against each other while being heated to be caused to thermally fuse to each other.

10. A process as set forth in claim 1, in which said semiconductor structures are forced against each other while being heated to be caused to thermally fuse to each other.

11. A process as set forth in claim 1, in which the semiconductor element in one of said semiconductor structures is constituted by an n-type MOS transistor and the semiconductor element in the other semiconductor structure is constituted by a p-type MOS transistor.

12. A process as set forth in claim 1, in which the semiconductor element in one of said semiconductor structures is constituted by an optoelectric transducer element.

13. A process as set forth in claim 1, in which said semiconductor element in one of said semiconductor structures is constituted by a compound semiconductor device and the other semiconductor structure is constituted by a silicon semiconductor device.

14. A process as set forth in claim 1, in which said dielectric adhesive substance consists of a polyimide resin.

15. A process as set forth in claim 3, in which said electrically conductive material consists of gold.

* * * * *